United States Patent [19]

Miki

[11] 4,080,575

[45] Mar. 21, 1978

[54] ELECTRONIC TIME SIGNALLING DEVICE

[75] Inventor: Shigenobu Miki, Himeji, Japan

[73] Assignee: Tokyo Jihoki Manufacturing Company, Limited, Japan

[21] Appl. No.: 738,345

[22] Filed: Nov. 3, 1976

[51] Int. Cl.² .................... G01R 29/02; H03K 17/00; H03K 5/00

[52] U.S. Cl. .................................. 328/129; 307/293; 235/92 T; 328/48; 328/72

[58] Field of Search .................. 307/293; 328/48, 129, 328/130, 131, 72; 235/92 T, 92 TF

[56] References Cited

U.S. PATENT DOCUMENTS

| | | | |
|---|---|---|---|
| 2,970,226 | 1/1961 | Skelton et al. | 307/293 |
| 3,137,818 | 6/1964 | Clapper | 328/48 |
| 3,621,403 | 11/1971 | Seiy | 328/48 |
| 3,629,710 | 12/1971 | Durland | 328/48 |
| 3,646,371 | 2/1972 | Flad | 328/129 |
| 3,909,620 | 9/1975 | Matsuda et al. | 328/129 |
| 3,939,361 | 2/1976 | Aidala | 328/48 |
| 4,001,699 | 1/1977 | Denny et al. | 328/48 |

*Primary Examiner*—Stanely D. Miller, Jr.
*Attorney, Agent, or Firm*—Eugene E. Geoffrey, Jr.

[57] ABSTRACT

A time signalling device which includes a clock for generating an actual time signal, a time preset circuit for presetting a time to be signalled, a comparator for comparing the actual time with the preset time and producing an output signal when coincidence occurs.

3 Claims, 6 Drawing Figures

ELECTRONIC TIME SIGNALLING DEVICE

This invention relates to a novel and improved time signalling device for producing a time signal at a preset time to energize a time siren or other equipment for the purpose of automatic timing control.

In prior art time signalling devices, a time presetting disc is provided having a number of small holes bored along the periphery thereof, and, in case of presetting a time to be signalled, a pin has been inserted into a specific hole which corresponds to that time. In such prior art devices, however, it has not only been troublesome to preset the time but also impossible to make the interval of the preset times less than five minutes or so since the size of the presetting disc and, accordingly, the interval of the holes are limited to some minimum value.

Therefore, an object of this invention is to provide a novel and improved time signalling device which can overcome the above mentioned difficulties by enabling preset operation electrically with digital codes.

According to this invention, the time signalling device comprises a clock section for generating a time signal representing the actual time in digital coded form, a time preset circuit for presetting a time to be signalled in digital coded form, a comparator connected to said clock section and said time preset circuit for comparing said actual time with said preset time to produce a coincidence signal when coincidence is obtained therebetween, and a load driving circuit connected to said comparator for producing a load driving signal in response to said coincidence signal for a predetermined length of time.

Other objects and features of this invention will be described in more detail hereinunder with reference to the accompanying drawings.

In the drawings.

Throughout the drawings, like reference symbols are used to denote like structural components.

Figure 1:
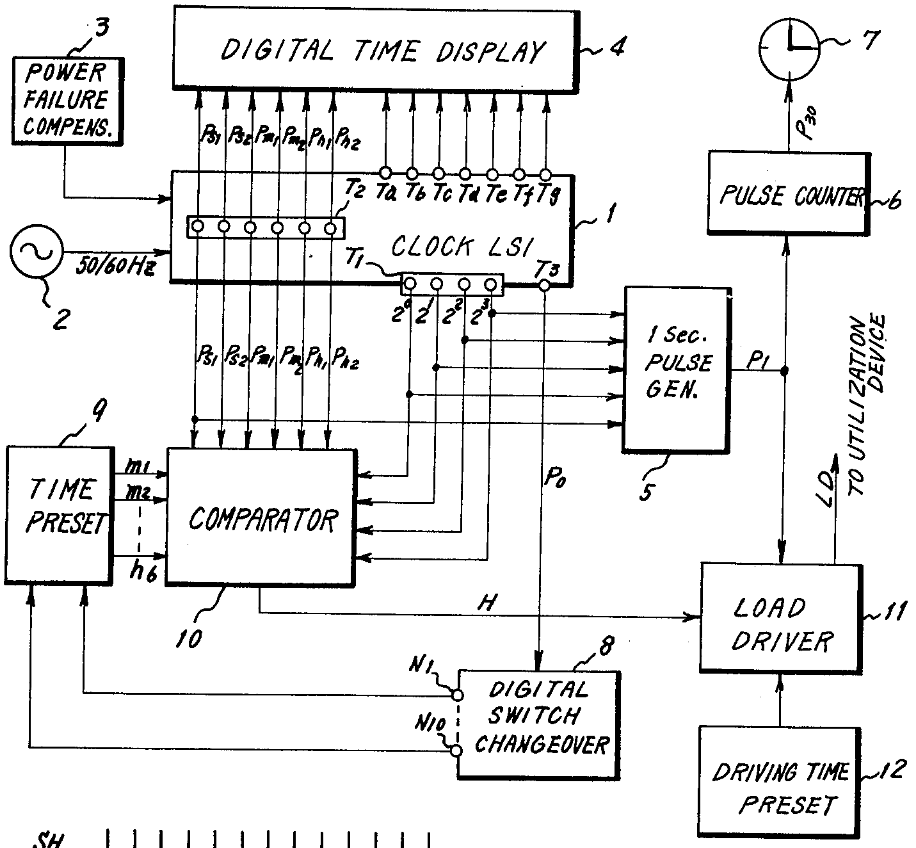
FIG. 1 is a schematic block diagram illustrating an embodiment of the time signalling device according to this invention.

Referring first to FIG. 1, the device includes a largescaled integrated circuit 1 serving a clock function (hereinunder referred to as "clock LSI 1") which is well known in the field of electronic digital clocks. The clock LSI 1 receives an AC voltage of 50 or 60 Hz from a commercial AC source 2 and produces sequentially a binary-coded time signal of four bits $2^0$, $2^1$, $2^2$, and $2^3$ from a terminal $T_1$, six timing signals $Ps_1$, $Ps_2$, $Pm_1$, $Pm_2$, $Ph_1$ and $Ph_2$ from a terminal $T_2$, a shift signal $P_0$ from a terminal $T_3$ and seven display signals from terminals $T_a$, $T_b$, $T_c$, $T_d$, $T_e$, and $T_f$, and $T_g$. The input of the clock LSI 1 is also connected to an power failure compensator 3 which includes a R-C oscillator circuit and produces a clock pulse train of 50 or 60 Hz in case of failure of the commercial source 2. It is of course more preferably to use a crystal oscillator instead of the commercial source or an R-C oscillator in order to improve accuracy.

Figure 3:
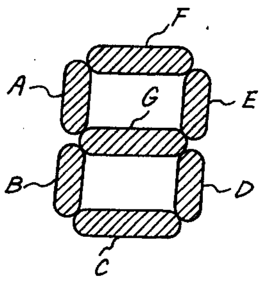
FIG. 3 is a plan view illustrating an embodiment of the display element used in the device of FIG. 1.

The clock LSI 1 is accompanied with a digital time display device 4 having six display elements, one of which is shown in FIG. 3 as an example, which are put in charge of the first and second digits of "seconds", the first and second digits of "minutes" and the first and second digits of "o'clock", respectively. The timing signals $Ps_1$, $Ps_2$, $Pm_1$, $Pm_2$, $Ph_1$, and $Ph_2$ are respectively connected to these six display elements and the display signals from the seven terminals $T_a$, $T_b$, . . . $T_g$ are respectively connected to seven display segments A, B, C, D, E, F, and G (FIG. 3) of the respective elements. Such dynamic digital display of time is well known in the art and, therefore, will not be described further.

Figure 2:
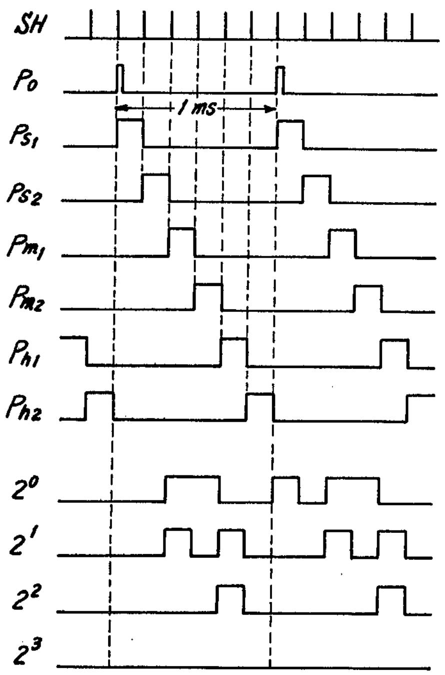
FIG. 2 is a waveform diagram representing principal signal waveforms appearing at specific portions of the device of FIG. 1, which is presented as an aid to explain the operation of the device.

As shown in FIG. 2, the timing signals $Ps_1$, $Ps_2$, $Pm_1$, $Pm_2$, $Ph_1$, and $Ph_2$ each have period such as one millisecond and appear successively and repeatedly in this order at a fixed time interval such as 1/6 millisecond. In the lefthand half of FIG. 2, the binary codes "$2^3 2^2 2^1 2^0$" appearing in synchronism with the timing signals $Ps_1$, $Ps_2$, $Pm_1$, $Pm_2$, $Ph_1$, and $Ph_2$ are "0000", "0000", "0011", "0001", "0110" and "0000", respectively, which correspond respectively to decimal codes 0, 0, 3, 1, 6 and 0. Accordingly, the time signal in the lefthand half of FIG. 2 represents the time $6_h 13_m 00_s$, that is, 13 minutes past 6 o'clock. In the righthand half of FIG. 2, however, there is a change of the first bit "$2^0$" at the timing pulse $Ps_1$, while the other bits are maintained as they are. Thus, the time signal in the righthand half of FIG. 2 respesents the time, $6_h 13_m 01_s$.

The time signal from the terminal $T_1$ of the clock LSI 1 is connected to a one-second pulse generator 5 which produces a clock pulse train $P_1$ having a period of one second. This is done in the generator 5 by comparing the binary code at a specific timing pulse $Ps_1$ with its preceding one and producing a pulse when a difference is sensed therebetween. The one-second pulse train $P_1$ is connected to a pulse counter 6 which is arranged to produce a pulse at every thirty count. The counter 6 therefore produces a clock pulse train $P_{30}$ having a period of 30 seconds. The pulse train $P_{30}$ is connected to some indicators or secondary clocks 7, only one of which is shown, to move them by 30 seconds with each pulse.

The shift signal $P_0$ produced from the terminal $T_3$ of the clock LSI 1 is applied to a digital switch changeover circuit 8. The circuit 8 is provided with, for example, ten output terminals $N_1$, $N_2$, . . . $N_{10}$ and produces output pulses therefrom sequentially and circularly in synchronism with the input shift signal $P_0$. The output terminals $N_1$, $N_2$, . . . $N_{10}$ are respectively connected to ten digital switches included in a time presetting circuit 9 to actuate them sequentially in time division fashion. Ten or less time points which are to be signalled can be preset in the time presetting circuit 9 independently of each other by these digital switches which are particularly described later.

The time presetting circuit 9 has thirteen outputs $m_1$, $m_2$, $m_3$, $m_4$, $m_5$, $m_6$, $m_7$, $h_1$, $h_2$, $h_3$, $h_4$, $h_5$, and $h_6$ representing binary bits. The outputs $m_1$, $m_2$, $m_3$, and $m_4$ represent respectively the first, second, third and fourth bits $2^0$, $2^1$, $2^2$, and $2^3$ of the binary code expressing the first digit of "minute", the outputs $m_5$, $m_6$, and $m_7$ represent respectively the first, second and third bits $2^0$, $2^1$, and $2^2$ of the binary code expressing the second digit of "minute", the outputs $h_1$, $h_2$, $h_3$, and $h_4$ represent respectively the first, second, third and fourth bits $2^0$, $2^1$, $2^2$, and $2^3$ of the binary code expressing the first digit of "o'clock" and the outputs $h_5$ and $h_6$ represent respectively the first and second bits $2^0$ and $2^1$ of the binary code expressing the second digit of "o'clock". These outputs are connected to a comparator circuit 10.

The comparator 10 compares the preset times represented by the thirteen inputs $m_1, m_2, \ldots h_5$ and $h_6$ from the time presetting circuit 9 with the actual time defined by the time signal $2^3 2^2 2^1 2^0$ and the timing signals $Ps_1$, $Ps_2$, $Pm_1$, $Pm_2$, $Ph_1$ and $Ph_2$ from the clock LSI 1 and produces a coincidence output H when coincidence is obtained therebetween. The coincidence output H is applied to a load driver circuit 11 to actuate it to produce a load driving signal LD for energizing utilization devices such as bells and sirens. The load driver circuit 11 includes a pulse counter for counting one second pulses $P_1$ supplied from the one second pulse generator 5, and is accompanied with a driving time presetting circuit 12 including for example a digital switch for presetting a time interval for which the load driving signal LD is to be maintained. The load driver circuit 11 stops the load driving signal LD when it counts the number of pulses $P_1$ corresponding to the time which is preset in the presetting circuit 12.

Figure 4:
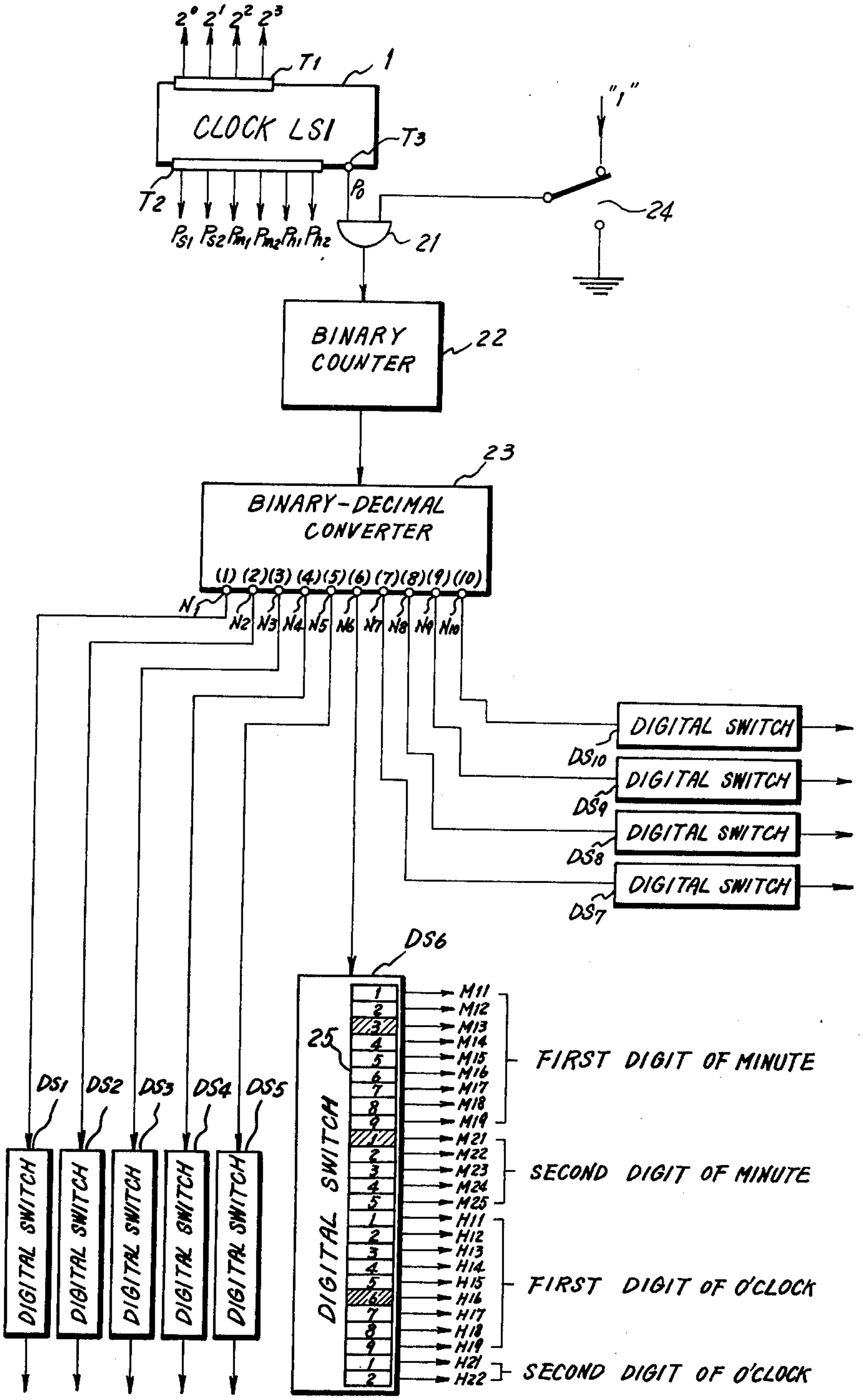
FIGS. 4, 5, and 6 are schematic circuit diagrams illustrating circuit configurations of principal sections of the device of FIG. 1.
Figure 5:
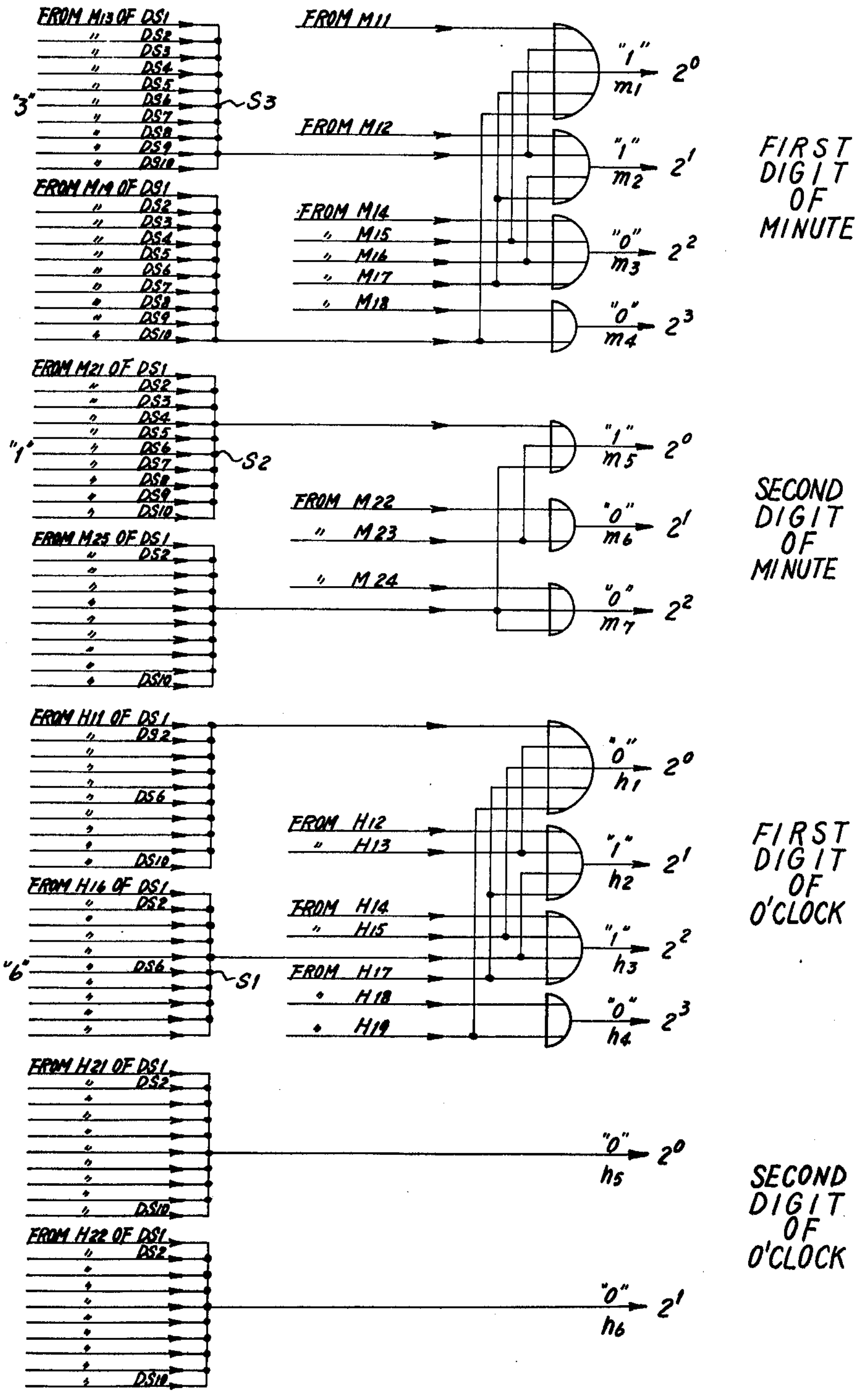

Referring next to FIGS. 4 and 5, detailed configurations of the digital switch changeover circuit 8 and the time presetting circuit 9 will be described below.

The digital switch changeover circuit 8 includes an AND gate 21, a binary counter 22 and a binary-decimal converter 23. The shift signal $P_0$ (FIG. 2) from the terminal $T_3$ of the clock LSI 1 is connected through the AND gate 21 to the binary counter 22. The other input of the AND gate 21 has applied thereto a HIGH level voltage through a changeover switch 24. The pulses of the shift signal $P_0$ is counted by the binary counter 22 and the count is converted into decimal code by the binary-decimal converter 23. The binary-decimal converter 23 has ten output terminals $N_1, N_2, \ldots N_{10}$ which correspond respectively to decimal codes 1, 2, 3, . . . 10. As the binary counter 22 is arranged to restore its initial state after every count of ten, the converter 23 produces an output from the terminal $N_1$ when the counter 22 counts one pulse and the output is shifted one by one at every count towards the terminals $N_2$, $N_3$ and so on to the terminal $N_{10}$ and then returned to the original terminal $N_1$.

The output of the binary-decimal converter 23 is thus sequentially applied to ten digital switches $DS_1, DS_2, \ldots DS_{10}$ which are included in the time presetting circuit 9 and connected respectively to the output terminals $N_1, N_2, \ldots N_{10}$ of the converter 23. The output of the converter 23 is applied as an actuating signal of each digital switch and the digital switches are thereby actuated sequentially and circularly in time division fashion. It is understood that, when the changeover switch 24 is turned to the grounded terminal, this automatic actuation ceases and manual actuation may be effected.

Although each digital switch may be of known normal type and no further description is needed, the digital switch $DS_6$ is shown more particularly for aiding the later description. The digital switch includes a keyboard 25 having twenty-five keys arranged for enabling the presetting of any time by "minute-past-o'clock" in 24 hour fashion, and the same number of outputs $M_{11}$, $M_{12}, \ldots M_{19}, M_{21}, M_{22}, \ldots M_{25}, H_{11}, H_{12}, \ldots H_{19}, H_{21}$ and $H_{22}$ corresponding respectively to these keys. When one intends to preset "13 minutes past 6 o'clock", that is, $\mathbf{6_h 13_m}$, in the digital switch $DS_6$, for example, the keys "6", "1" and "3" as shown in shaded form in the drawing are to be pushed. In this condition, the digital switch $DS_6$ produces outputs from the terminals $M_{13}$, $M_{21}$ and $H_{16}$ when the actuating signal is applied from the terminal $N_6$ of the binary-decimal converter 23. The other digital switches are exactly the same in structure and operation as the switch $DS_6$ and, therefore, ten kinds of time to be signalled can be preset independently in these ten digital switches.

FIG. 5 shows the rear half of the time presetting circuit 9, for converting the time signal supplied from each digital switch in decimal expression into binary expression. The circuit of FIG. 5 has 25 sets of inputs corresponding respectively to the 25 outputs of each digital switch, each set consisting of ten inputs corresponding respectively to the 10 digital switches, while only eight sets are particularly shown in the drawing for simplification. The outputs of all digital switches are respectively connected to the inputs of this circuit and pass a logic circuit comprising OR gates to produce thirteen outputs $m_1, m_2, \ldots m_7, h_1, h_2, \ldots h_6$, as shown. The outputs $m_1$, $m_2$, $m_3$ and $m_4$ give a binary code representing the first digit of "minutes", the outputs $m_5$, $m_6$ and $m_7$ give a binary code representing the second digit of "minutes", the outputs $h_1$, $h_2$, $h_3$ and $h_4$ give a binary code representing the first digit of "o'clock" and the outputs $h_5$ and $h_6$ give a binary code representing the second digit of "o'clock", as described previously in conjunction with FIG. 1.

For example, when the time "$\mathbf{06_h 13_m}$" is preset in the digital switch $DS_6$ as abovementioned, HIGH level signals ";" are applied to the input terminals $S_1$, $S_2$ and $S_3$ in the drawing in correspondence with decimal "6", "1" and and "3" respectively. It is easily understood from the drawing that these inputs appear as HIGH levels of the outputs $m_1$, $m_2$, $m_5$, $h_2$, and $h_3$. Accordingly, the first digit of "minute" is "0011", the second digit thereof is "0001", the first digit of "o'clock" is "0110" and the second digit thereof is "0000". Thus, the preset time in the digital switch has been converted into binary-coded form. The binary-coded output is then supplied to the comparator 10 as described previously.

Figure 6:
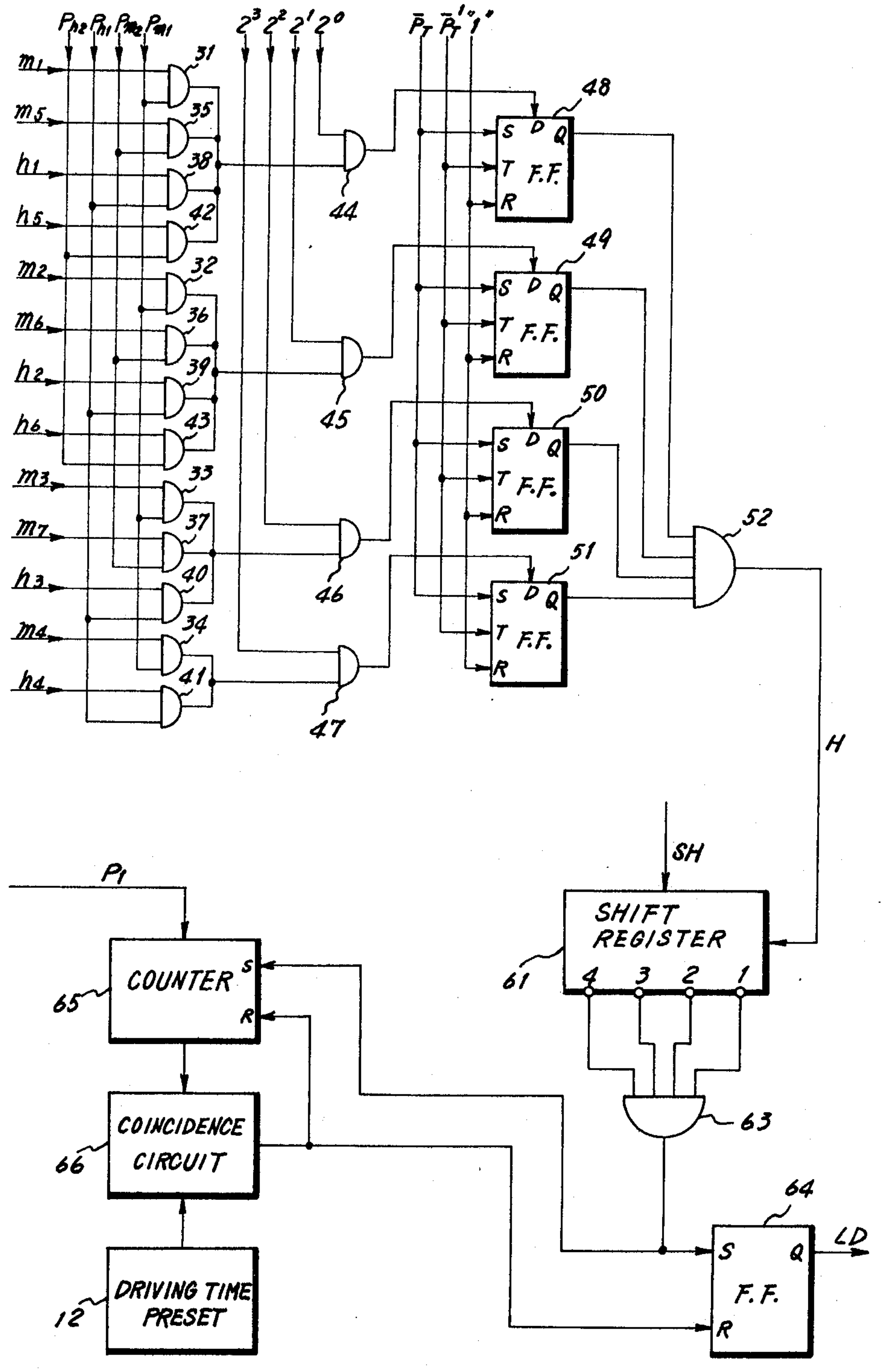

FIG. 6 is a detailed illustration of an embodiment of a part of the circuit of FIG. 1, wherein the upper half represents the comparator circuit 10 and the lower half represents the load driver circuit 11.

The outputs $m_1, m_2, \ldots m_7, h_1, h_2, \ldots h_6$ of the time presetting circuit 9 are applied respectively to the inputs of AND gates 31, 32, . . . 43. In addition, timing signals $Pm_1$ from the clock LSI 1 are applied to the other inputs of the AND gates 31, 32, 33, and 34, $Pm_2$ to the other inputs of the AND gates 35, 36, and 37, $Ph_1$ to the other inputs of the AND gates 38, 39, 40, and 41 and $Ph_2$ to the other inputs of the AND gates 42 and 43, respectively. The outputs of the AND gates 31, 35, 38 and 42 are connected to one input of an AND gate 44, the outputs of the AND gates 32, 36, 39 and 43 are connected to one input of an AND gate 45, the outputs of the AND gates 33, 37 and 40 are connected to one input of an AND gate 46, and the outputs of the AND gates 34 and 41 are connected to one input of the AND gate 47. From the clock LSI 1, moreover, the respective bits of the binary time signal are applied to the other inputs of the AND gates 44, 45, 46 and 47, respectively.

The outputs of the four AND gates are connected respectively to D-inputs of four R-S-T flip-flops 48, 49, 50 and 51 having D-inputs. To the R and S-inputs of the flip-flops, applied are signals $\overline{P}_T$ and $\overline{P}_T'$, respectively, which are the inversions of the logic sum of the six timing signals $Ps_1$, $Ps_2$, $Pm_1$, $Pm_2$, $Ph_1$ and $Ph_2$ which have been separately amplified and shaped by separate circuits (not shown). It is obvious that both signals are at LOW level as long as all timing signals are produced normally but become HIGH level "1" when any timing signal disappears accidentally. To the reset input R of each flip-flop, applied always is HIGH level "1". Accordingly, if there should be any accident in the timing signals, the flip-flops would be disabled to prevent erroneous time signalling. The Q-outputs of the four flip-flops are applied to a common AND gate 52, the output of which is connected to a shift register 61 included in the load driving circuit 11 of FIG. 1.

To the shift input of the shift register 61, applied is a shift signal SH which is a clock pulse synchronized with the timing signals as shown in FIG. 2 and is produced by a separate circuit (not shown) from the timing signals. The shift register 61 has 4 bits and corresponding four parallel outputs are applied to an AND gate 63 the output of which is applied to S-input of the R-S flip-flop 64. On the other hand, the one-second pulse train $P_1$ from the one-second pulse generator 5 (FIG. 1) is applied to a counter 65 and the count output thereof is applied to a coincidence circuit 66. To the other input of the coincidence circuit 66, applied is a time signal which is preset in the driving time preset circuit 12 which has been mentioned above in conjunction with FIG. 1. The coincidence output of the coincidence circuit 66 is applied to the reset input R of the flip-flop 64 to reset it and also applied to the reset input R of the counter 65. To the set input S of the counter 65, applied is the output of the AND gate 63.

In operation, each of the AND gates 31, 32, . . . 43 let pass each bit of each digit of the preset time signal only while each timing signal corresponding to said digit exists, and each bit is compared in each of the AND gates 44, 45, 46 and 47 with each bit of the corresponding digit of the actual time signal from the clock LSI 1. Each AND gate produces an output when coincidence is obtained between both bits as compared, and the AND gate 52 produces an output when coincidence is obtained between specific digits of both time signals. Accordingly, if the actual time coincides with the preset time, the AND gate should produce four output pulses without interruption when the times are expressed with "o'clock" and "minute". As the output pulses of the AND gate 52 are shifted in the shift register 61 by the shift signal SH in synchronism with the timing pulses, it should be easily understood that the AND gate 63 can produce an output when the above time coincidence is obtained. The flip-flop 64 is set by this output of the AND gate 64 to produce the load driving signal LD which is to be applied to the utilization device, as previously mentioned in conjunction with FIG. 1. The counter 65 begins to count the one-second pulse $P_1$ by actuation of the output of the AND gate 63 and applies the count output successively to the coincidence circuit 66. When coincidence is obtained between the count and the preset time, the coincidence output of the coincidence circuit 66 is applied to the flip-flop 64 to reset it, thereby stopping the load driving signal LD.

It should be noted that the above description has been made merely in conjunction with an embodiment of this invention and various modifications, variations and changes can be made without departing from the scope of this invention as defined in the appended claims.

What is claimed is:

1. A time signalling device, comprising a clock circuit for producing a binary signal representing the actual time, a timing signal designating the respective digits of said binary signal and a driving signal synchronous with said timing signal, a plurality of time presetting devices each producing a decimal signal representing a time previously stored therein upon actuation means for actuating said time setting devices sequentially in time division fashion under control of said driving signal, a common decimal-binary converter for converting said decimal signals into binary signals, a comparator circuit for comparing said binary signal representing the actual time with the output of said converter under control of said timing signal, and signalling means driven by the coincidence output of said comparator circuit.

2. A time signalling device, according to claim 1, wherein said time presetting devices each includes at least one digital switch for feeding in said time to be signalled in decimal coded form to said decimal-binary converter for converting said input decimal-coded time into a plurality of binary codes corresponding respectively to said respective digits.

3. A time signalling device, according to claim 1, wherein said clock circuit generates clock pulses having a predetermined frequency and said signalling means includes a load driving circuit, a counter for counting said clock pulses and means actuated by said coincidence signal to produce said load driving signal and deactuated when the count of said counter reaches a predetermined value.

* * * * *

UNITED STATES PATENT OFFICE
CERTIFICATE OF CORRECTION

Patent No. 4,080,575 Dated March 21, 1978

Inventor(s) Shigenobu Miki

It is certified that error appears in the above-identified patent and that said Letters Patent are hereby corrected as shown below:

Assignee should read: -- [73] Assignee: Toyo Jihoki Manufacturing Company, Limited --.

Signed and Sealed this

*Twenty-fifth* Day of *July 1978*

[SEAL]

*Attest:*

RUTH C. MASON
*Attesting Officer*

DONALD W. BANNER
*Commissioner of Patents and Trademarks*